United States Patent [19]

Ishimatsu

[11] Patent Number: 5,299,096
[45] Date of Patent: Mar. 29, 1994

[54] LED MOUNTING HOLDER AND DEVICE FOR MOUNTING LED USING IT

[75] Inventor: Yoshikazu Ishimatsu, Kanagawa, Japan

[73] Assignee: Sony Corporation, Tokyo, Japan

[21] Appl. No.: 22,285

[22] Filed: Feb. 25, 1993

[30] Foreign Application Priority Data

Feb. 29, 1992 [JP] Japan .................. 4-079118

[51] Int. Cl.$^5$ .............................. H05K 7/02
[52] U.S. Cl. .................... 361/807; 361/730; 361/736; 361/761; 174/138 G; 174/52.1; 257/678
[58] Field of Search .............. 361/730, 736, 738, 748, 361/761, 807, 809; 174/52 R, 138 G; 257/678

[56] References Cited

U.S. PATENT DOCUMENTS 3,962,719  6/1976  Pfaff .......................... 357/74
4,219,172  8/1980  Murayama .................. 248/273
4,577,259  3/1986  Latasiewicz et al. ......... 361/400

Primary Examiner—Leo P. Picard
Assistant Examiner—Young Whang
Attorney, Agent, or Firm—Lewis H. Eslinger; Jay H. Maioli

[57] ABSTRACT

An LED mounting holder for mounting one or more LEDs on a printed circuit board and for having the printed circuit board on a front panel of an electronic apparatus with the LEDs mounted on the printed circuit board. The LED mounting holder has a plurality of holding sections each formed by a plate of an electrically conductive material, a plurality of height position setting sections, a contacting section of an electrically conductive material for being contacted with the main body of the electronic apparatus, and a holder support for supporting the LED mounting holder by the printed circuit board. The holding sections are provided at the positions on the holder in register with the mounting positions of the LEDs on the printed circuit board for holding the LEDs and are protruded towards the distal ends of the LEDs for facing away from the printed circuit board. The height setting sections are provided at the positions on the holder in register with the mounting positions of the LEDs on the printed circuit board for setting the height positions of the distal ends of the LEDs held by the holding sections. When mounted in the electronic apparatus, the holder assures accurate setting of the mounting height positions and the mounting positions in the array of the LEDs, while preventing static charges from being introduced into the main body of the electronic apparatus via the holding sections and contact sections.

16 Claims, 7 Drawing Sheets

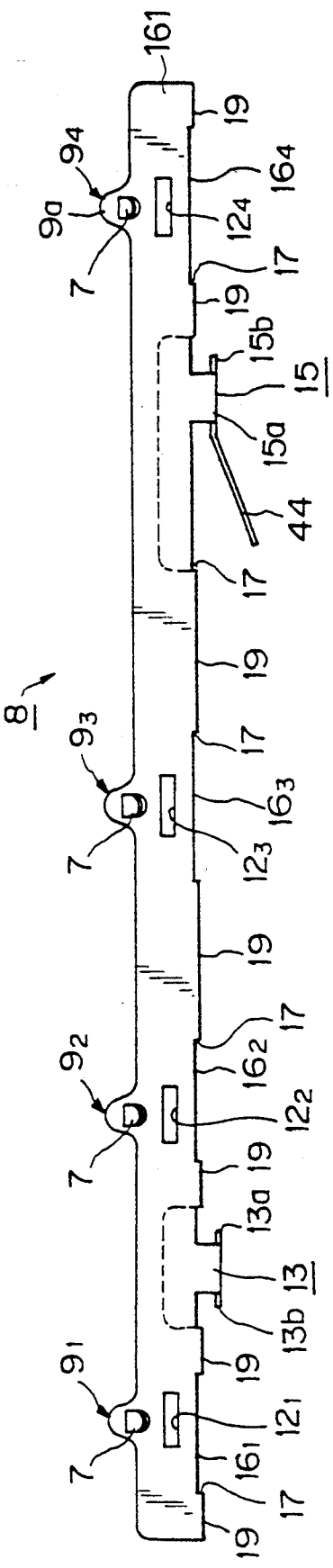
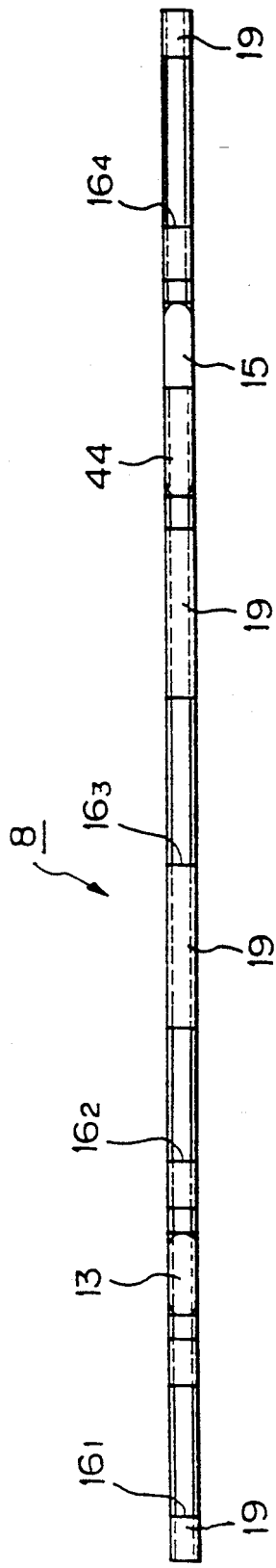

LED MOUNTING HOLDER AND DEVICE FOR MOUNTING LED USING IT

BACKGROUND OF THE INVENTION

1. Field of the Invention

This invention relates to an LED mounting holder used for setting the mounting position for plural diodes mounted on a front panel of an electronic apparatus, or setting the relative mounting height thereof, and a device for mounting the LEDs using such holder.

2. Description of the Prior Art

On a front panel, such as an operating panel, provided on the front side of a variety of electronic apparatuses, a plurality of light emitting diodes (LEDs) are usually arranged as display means for allowing an operator to recognize the current operating state or to prompt the operator's attention.

When LEDs are mounted on the printed circuit board, usually the external connection terminals of the LEDs are introduced into component mounting openings, such as throughholes, bored in the printed circuit board at predetermined mounting positions, such as at LED mounting positions on a front panel, and are soldered in situ for establishing electrical and mechanical connections in a required manner.

Consequently, for mounting plural LEDs by soldering on the printed circuit board for manufacturing an electronic apparatus having the LEDs mounted on its front panel, it is necessary to have the LEDs mounted with predetermined relative positioning and height setting on the printed circuit board prior to the soldering process. This is because the LEDs are finally mounted in position by soldering.

That is, for mounting plural LEDs by soldering on the printed circuit board, it is a frequent practice to pass the printed circuit board, with external connection terminals of the LEDs introduced into the component mounting openings of the printed circuit board, through a soldering bath containing a solder therein in the melted state, for accomplishing the soldering process. In such case, the LEDs need to be held on the printed circuit at the predetermined position and height until the soldering operation comes to an end.

After the LEDs are soldered to the printed circuit board, they are mounted on the front panel of the electronic apparatus along with the printed circuit board. In such case, it is necessary for the LEDs not to become detached from the front panel. Meanwhile, when the LEDs mounted within a front panel produced by molding a non-conductive synthetic resin are handled by an operator, it may occur that static electrical charges are intruded from the operator into the electric circuit through LED elements as noise to produce malfunctions or destruct various driving circuits, For this reason, it is a frequent occurrence in the manufacture of electronic apparatus to take anti-static measures such as by bonding a metal piece in the form of a spring sheet or an electrically conductive foil or by applying an electrically conductive paint to the LEDs. However, such bonding or coating are not desirable because the number of the manufacturing steps is thereby increased.

On the other hand, for preventing static charges from being introduced into the elements of the LEDs, it is a frequent practice to provide the LEDs within a recessed part of the main body of the electronic apparatus so as not to protrude out of the front panel surface and to attach a piece of a transparent or semi-transparent acrylic photoconductive material to the front panel for conducting the light from the LEDs to the front panel surface. However, in such case, the light from the LEDs tends to be lowered in intensity due to passage through the piece of the photoconductive material to darken the display on the front panel surface. Consequently, in order for the display on the front panel surface to be as bright as possible, it is necessary that the LEDs be mounted at mounting positions as close to the front panel surface as possible.

OBJECTS OF THE INVENTION

It is an object of the present invention to provide an LED mounting holder in which the relative mounting positions in the LED array and relative mounting height positions of the LEDs mounted on a mounting base plate may be set accurately.

It is another object of the present invention to provide an LED mounting holder in which, when the LEDs are mounted in the electronic apparatus, static charge may be prevented from being intruded via the elements of the LEDs into an electronic circuit within the electronic apparatus.

It is a further object of the present invention to provide an LED mounting holder in which the LEDs may be mounted at the correct positioning in the LED array and in the heightwise direction with respect to the front panel of the electronic equipment.

It is a further object of the present invention to provide an LED mounting holder in which the light emitted by the LEDs may be efficiently conducted to the surface of the front panel of the electronic apparatus.

It is a further object of the present invention to provide an LED mounting device whereby plural LEDs may be easily mounted on the front panel of the electronic apparatus.

Other objects and advantages of the present invention will become apparent from the following description of the preferred embodiments and the claims.

SUMMARY OF THE INVENTION

According to the present invention, there is provided an LED mounting holder for holding one or more LEDs for mounting the LEDs within an electronic apparatus. The holder is formed of an electrically conductive material and may for example be a metallic plate comprising a plurality of holding sections provided at the positions on the holder corresponding to positions on a mounting base plate mounting one or more of the LEDs. The holding sections hold the LEDs and are projected in a direction towards the distal ends of the LEDs for facing the base plate. A plurality of height position setting sections are provided at the positions on the holder corresponding to positions on the mounting base plate mounting one or more of the LEDs for setting the height positions of the distal ends of the LEDs held by the holding sections. A contacting section of an electrically conductive material is provided for contacting with a main body of the electronic apparatus, and a holder supporting section is also provided for holding the holder by the base plate.

The height position setting section provided in the holder plays the role of setting the mounting height position of the distal ends of the LEDs by taking advantage of the contour of the LEDs. The holder supporting sections play the role of clamping the mounting base plate for the LEDs for supporting the holder itself on the mounting base plate.

Consequently, for holding the LEDs by the holder, the LEDs are held by the holding parts of the holder at the mounting height positions as set by the height position setting sections. The external connection terminals of the LEDs are inserted into the component mounting openings provided at predetermined positions in the mounting base plate. The holder holding the LEDs is supported by the holder supporting sections on the mounting base plate. The mounting base plate supporting the holder is passed through a soldering bath for soldering the external connection terminals of the LEDs to the mounting base plate for establishing electrical and mechanical connection of the LEDs with respect to the mounting base plate.

For facilitating mounting of the LEDs in the front panel formed of a non-conductive synthetic resin material, the holding sections for the LEDs are formed with resilient tongues for securing the LEDs in a pair of clamping sections provided on the reverse sides of the front panel as well as preventing inadvertent detachment of the LEDs.

Consequently, the holder is designed for holding the LEDs at the correct mounting positions as set by the holding sections and at the correct height positions as set by the mounting height setting sections for facilitated the mounting of the LEDs on the mounting base plate. The holder for the LEDs is formed of an electrically conductive material and has a contacting part to the main body of the electronic apparatus to enable static charges to be conducted from outside into the main body of the electronic apparatus.

BRIEF DESCRIPTION OF THE DRAWINGS

FIG. 1 is a front view showing an LED mounting holder according to an embodiment of the present invention.

FIG. 3 is a bottom view showing the LED mounting holder shown in FIG. 1.

DETAILED DESCRIPTION OF THE PREFERRED EMBODIMENTS

Figure 2:
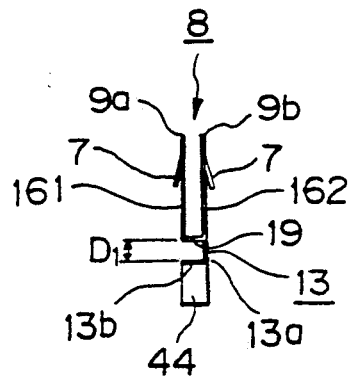
FIG. 2 is a left-hand side view showing the LED mounting holder shown in FIG. 1.

Referring to the drawings, an LED mounting holder and the manner in which plural LEDs are mounted on a front panel of an electronic apparatus using such holder, according to the present invention, will be explained in detail.

The LED mounting holder, that is an LED holder 8, is formed of an electrically conductive material, and is designed and constructed as shown in FIGS. 1 to 3. That is, the LED holder 8 includes four holding sections $9_1$ to $9_4$ provided at the positions of the LED holder corresponding to the LED mounting positions on a printed circuit board, which is a mounting base pate mounting a plurality of, herein four, LEDs, so that the holding sections are protruded in a direction towards the distal ends of the LEDs for holding the LEDs, four height position setting sections $12_1$ to $12_4$ provided at the positions on the LED holder corresponding to the LED mounting positions on the printed circuit board for setting the height positions of the distal ends of the LEDs held by the holding sections $9_1$ to $9_4$, a contact section 44 for contacting with a chassis of the main body of the electronic apparatus formed of an electrically conductive material, and holder supports 13 and 15 for supporting the LED holder by the printed circuit board.

FIG. 1 shows the LED holder 8 of the present embodiment in a front view, while FIGS. 2 and 3 show the holder in a left-hand side view and bottom view, respectively.

Figure 4:
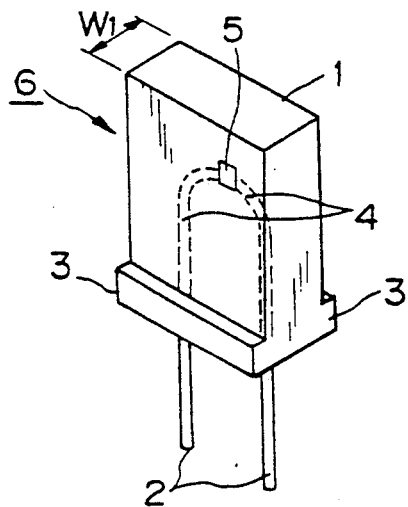
FIG. 4 is a perspective view showing an LED held by the LED mounting holder shown in FIG. 1.

An LED 6 held by the LED holder 8 according to the present invention is briefly explained. The LED 6 is made up of a pair of external connection terminals 2, supplied with electrical energies from outside, a pair of inner leads 4 connected to the terminals 2, light emitting element LED element 5, connected to the distal ends of these inner leads 4, and a resin part 1 of a light-transmitting synthetic resin covering the inner leads 4 and the light emitting element 5, as shown in FIG. 4. That is, the light emitting element 5 and the inner leads 4 are encapsulated in the resin part 1. The resin part 1 of the light emitting diode 6 is formed as a rectangular box and lugs 3, 3 are protuberantly formed on both lateral sides at the lower end of the resin part 1 from which project the external connection terminals 2, 2. Four LEDs 6 designed as shown in FIG. 4 are adapted to be held by LED holder 8.

A concrete arrangement of the LED holder 8 according to the present invention is explained. The LED holder 8 is formed by punching and bending an electrically conductive resilient metal sheet. Referring to FIGS. 1 to 3, a pair of sidewall sections $16_1$, $16_2$ are formed upright facing each other on both sides of an elongated bottom plate 19. The sidewall sections $16_1$, $16_2$ are spaced apart from each other by a distance approximately equal to a width $W_1$ of the resin part 1 of the LED 6 and are inclined slightly so that the distance between distal ends thereof is slightly narrower than the width $W_1$ of the resin part 1.

A bottom plate 19 of the LED holder 8 is formed with openings $16_1$ to $16_4$ for allowing the terminals for external connection 2 provided on the proximal sides of the LEDs $6_1$ to $6_4$ to be protruded outwards. At the distal ends of the sidewall sections $16_1$, $16_2$ in register with the LEDs $6_1$ to $6_4$ to be mounted in position, there are protuberantly formed holding lugs 9a, 9b of a holding part or section 9 holding these LEDs $6_1$ to $6_4$ from both lateral sides. These holding lugs 9a, 9b project from the distal ends of the sidewall sections 161, 162 to such a height that, when the LEDs $6_1$ to $6_4$ are mounted on the LED holder 8 at a controlled heightwise mounting position, the holding lugs are protruded further beyond the position of the light emitting element 5 provided within the resin parts 1.

The holding lugs 9a, 9b, making up the holding part 9, are protuberantly formed at the distal ends of the sidewall sections 161, 162 which are spaced apart from each other by a distance slightly narrower than the width $W_1$ of the resin part 1 for resiliently holding the light emitting diode (LED) 6 inserted therebetween from both lateral sides. That is, the light emitting diode 6 is resiliently held from its both lateral sides by resiliency of the metallic plate of the LED holder 8.

At a mid height of the facing sidewall sections 161, 162 in register with the LEDs $6_1$ to $6_4$, there are formed height position setting sections $12_1$ to $12_4$, in the form of through-holes, in which are introduced paired projections 3, 3 formed on the proximal end of the resin parts 1 of the LEDs $6_1$ to $6_4$. These height position setting sections $12_1$ to $12_4$ are engaged by the projections 3 of the resin parts 1 for setting the holding height positions of the LEDs 6 with respect to the LED holder 8. The height position setting sections $12_1$ to $12_4$ are of the same height with respect to the bottom plate 19, so that, by engaging the projections 3 of the LEDs $6_1$ to $6_4$ in these height position setting sections $12_1$ to $12_4$, the distal ends of the resin parts 1 are at the same height level.

The LED holder 8 includes holder supports 13, 15 whereby a printed circuit board 20 to which the external connection terminals 2 of the LEDs 6 are soldered is clamped from both sides for having the LED holder 8 itself supported by the printed circuit board 20. These holder supporting sections 13, 15 are formed in the vicinity of both extreme ends of the elongated LED holder 8. As shown in FIGS. 1 and 2, the holder supporting sections 13, 15 are formed by segmenting a region of the LED holder 8 of a thin metal sheet extending from the sidewall section 162 to a portion of the bottom plate 19 and bending off the segmented region in the shape of a letter L. That is, the holder support 13 is made up of a depending section 13a extending in the direction of extension of the sidewall section 162 and a horizontal section 13b bent at a right angle with respect to the depending section 13a in a direction parallel to the bottom plate 19. Similarly, the holder support 15 is made up of a depending section 15a extending in the direction of extension of the sidewall section 162 and a horizontal section 15b bent at a right angle with respect to the depending section 15a in a direction parallel to the bottom plate 19. The distance $D_1$ between the horizontal sections 13b, 15b of the holder supports 13, 15 and the bottom plate 19 of the LED holder 8 is selected to be equal to or slightly lesser than the thickness $D_2$ of the printed circuit board 20 which is the mounting base plate supporting the LED holder 8.

A contact section 44 for electrical connection to the main body of the apparatus is formed for extending from one end of the horizontal section 15b of the holder support 15 in a direction away from the bottom plate 19, that is downwards in FIG. 1. The contact section 44 plays the part of establishing an electrical connection with a grounding potential of a chassis or the like of the main body of the apparatus, not shown.

For having plural light emitting diodes $6_1$ to $6_4$ held by the above-described LED holder 8, the resin parts 1 of the LEDs are clamped between the holding lugs 9a and 9b of the holding part 9 with the terminals for external connection 2 being projected via openings $16_1$ to $16_4$ beyond the surface of the bottom plate 19. At this time, the projections 3 on both sides at the distal end of the resin part 1 are engaged in the height position setting sections $12_1$ to $12_4$. The LEDs $6_1$ to $6_4$, thus held by the LED holder 8, with the resin part 1 held by the holding part 9 and with the projections 3 fitted in the height position setting sections $12_1$ to $12_4$, are aligned in the LED array and at the same height of the distal ends with respect to the resin parts 1.

Figure 5:
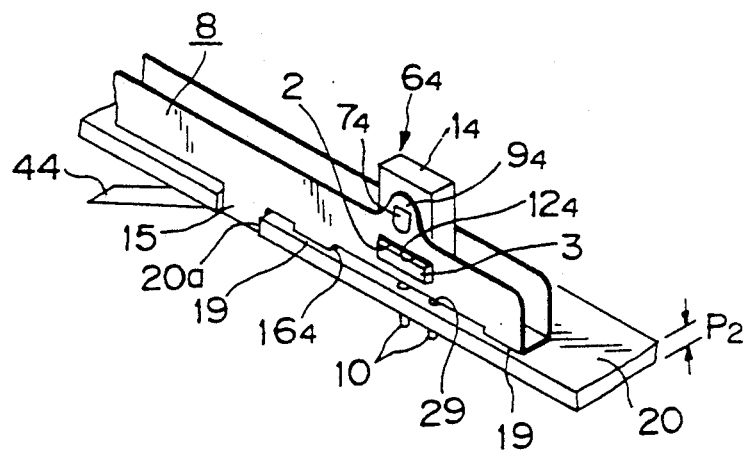
FIG. 5 is a perspective view showing the state in which the LED mounting holder, the LED and the printed circuit board are assembled together.

The LED holder 8, having the LEDs $6_1$ to $6_4$ held thereon, is supported by having one lateral side of the printed circuit board 20 clamped by the L-shaped holder supports 13, 15, as shown in FIG. 5. When the L-shaped holder 8 is supported by the printed circuit board 20, the external connection terminals 2 of the LEDs $6_1$ to $6_4$ are introduced into through-holes 29 which are component mounting openings formed in the printed circuit board 2. The portions of the printed circuit board 20 engaged by the holder supports 13, 15 are formed with cut-outs 20a for setting the engaging positions of these holder supports 13, 15, as shown in FIG. 5. That is, the mounting position of the LED holder 8 with respect to the printed circuit board 8 is set by having the holder supports 13, 15 engaged in the cut-outs 20a.

The external connection terminals 2 of the LEDs $6_1$ to $6_4$, passed through through-holes 29 bored in the printed circuit board 20, are electrically connected by solder 10 to an interconnection pattern formed on the printed circuit board 20. The LEDs $6_1$ to $6_4$ are also mechanically secured to the printed circuit board 20 by solder 10.

Soldering of the external connection terminals 2 of the LEDs $6_1$ to $6_4$ to the interconnection pattern formed on the printed circuit board 20 is achieved by passing the printed circuit board 20 supporting the LED holder 8 having the LEDs $6_1$ to $6_4$ held thereon through, for example, a molten soldering bath, not shown.

Meanwhile, the LED holder 8, formed in its entirety of an electrically conductive material, is mounted on the printed circuit board 20 with the bottom plate 19 in contact with the major surface of the printed circuit board 20. Consequently, when the LED holder 8 is mounted on the printed circuit board 20, as shown in FIG. 5, the LED holder tends to be in contact with the circuit pattern on the printed circuit board 20. For diminishing the contact area of the LED holder 8 on the printed circuit board 20, and preventing the LED holder 8 from being in contact with the printed circuit board 20, a recessed clearance 17 is formed on the portions of the lower edges of the sidewall sections 161, 162 in register with the openings $16_1$ to $16_4$ engaged by the LEDs. $6_1$ to $6_4$.

Figure 9:
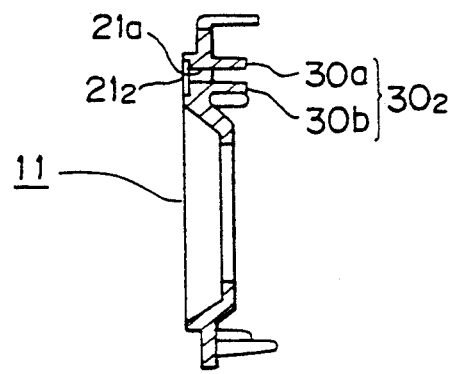
FIG. 9 is a cross-sectional view taken along line IX—IX of FIG. 8.
Figure 10:
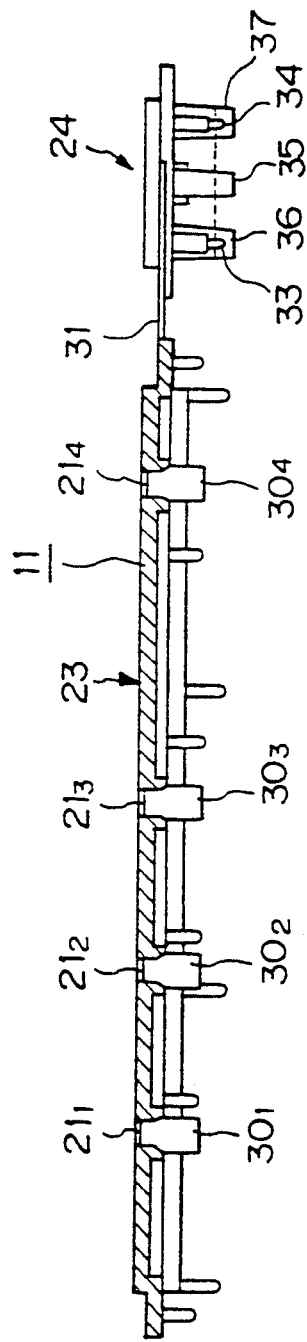
FIG. 10 is a cross-sectional side view taken along line X—X of FIG. 8.
Figure 11:
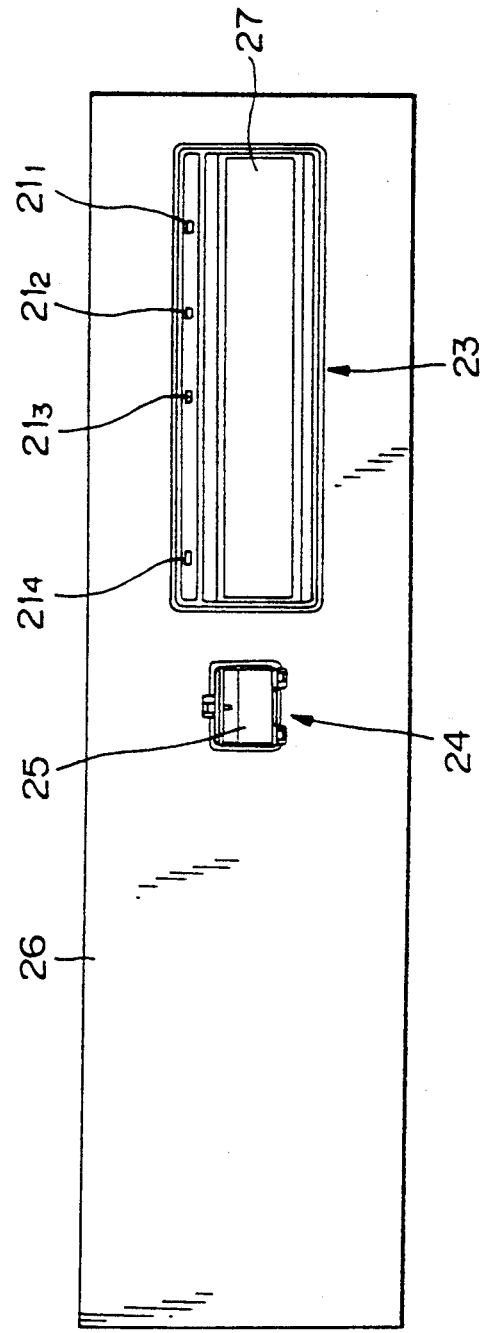
FIG. 11 is a front view showing a front chassis of a recording/reproducing apparatus front panel.
Figure 13:
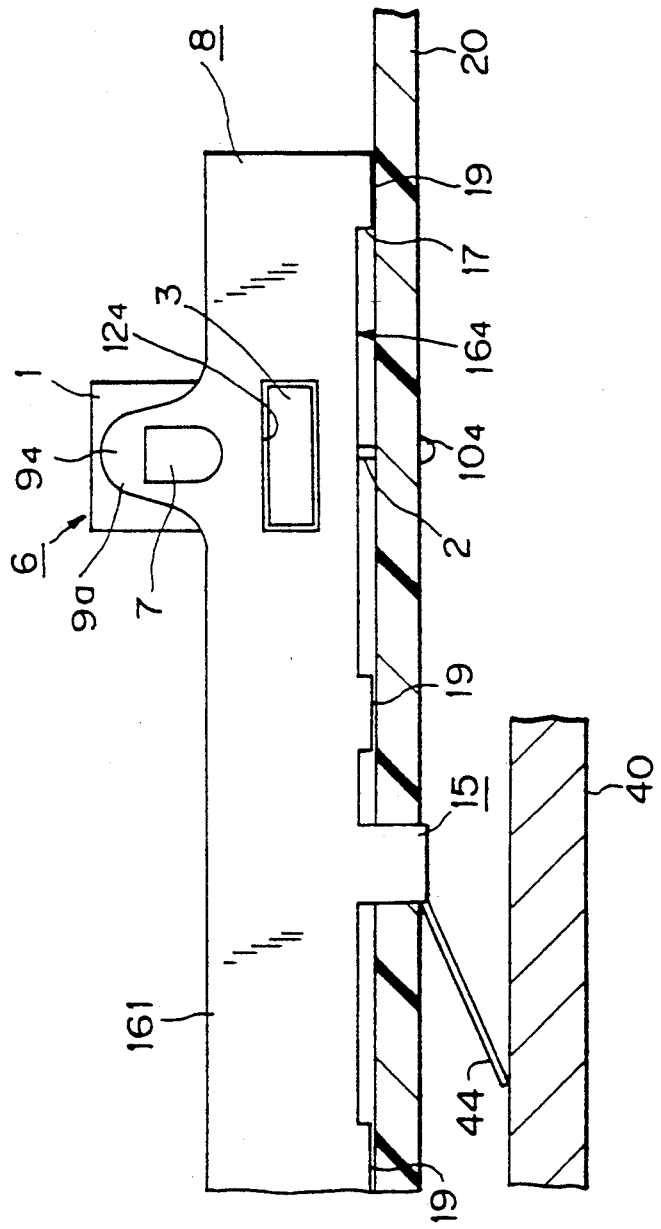
FIG. 13 is a front view showing the state in which a holder holding an LED thereon is mounted on a mounting base plate and arranged within an electronic apparatus.

The LED holder 8, having the LEDs $6_1$ to $6_4$ held thereon, and supported on the printed circuit board 20, as shown in FIG. 5, is arranged in the inside of a front panel 11 which is arranged within a front chassis 26 of the main body of the apparatus arranged as shown in FIG. 11 and which is molded from an electrically non-conductive material, as shown in FIGS. 6 to 10.

The LED holder 8, having the LEDs $6_1$ to $6_4$ held thereon, has its holding sections $9_1$ to $9_4$ clamped between clamping sections $30_1$ to $30_4$, each made up of a pair of facing protrusions 30a, 30b formed on the back side of the front panel 11, as shown in FIGS. 7, 9, 10 and 12. Each of the holding lugs 9a, 9b constituting each of the holding parts or holding sections $9_1$ to $9_4$ introduced into the clamping sections $30_1$ to $30_4$ of the front panel 11 has resilient tongues 7 which are segmented from the holding lugs and bent off so as to be protruded slightly outwardly from the surface of the holding lugs, as shown in FIGS. 1, 2 and 5. When the holding sections $9_1$ to $9_4$ are introduced into the clamping sections $30_1$ to $30_4$, the tongues 7 are pressed against the inner lateral sides of the protrusions 30a, 30b of the clamping sections $30_1$ to $30_4$ for holding the holding sections $9_1$ to $9_4$ in pressure contact with the inner surfaces of the clamping sections $30_1$ to $30_4$. With the holding sections $9_1$ to $9_4$ held within the clamping sections $30_1$ to $30_4$, the LED holder 8 may be reliably held in position without the risk of becoming detached from front panel 11.

Figure 6:
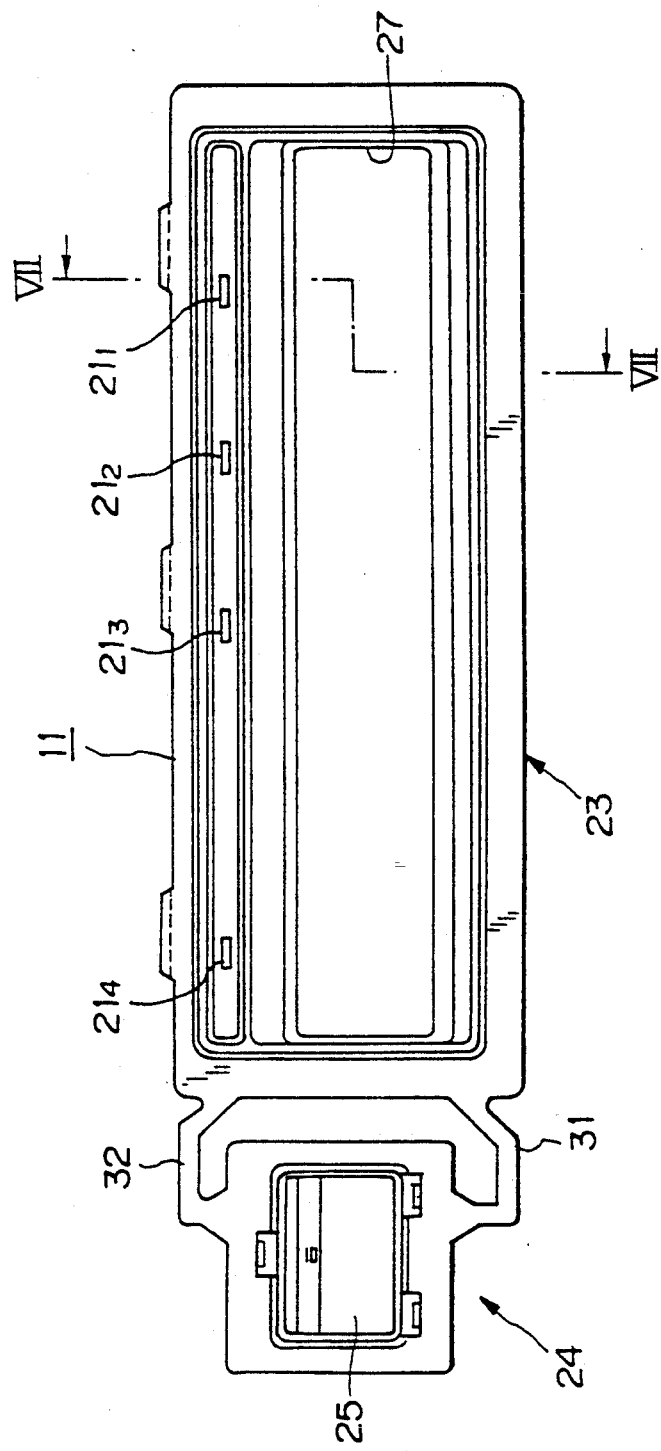
FIG. 6 is a front view showing a front panel of an electronic apparatus on which the LED mounting holder according to the present invention is mounted.

The tongues 7, projected downwards from the distal ends of the holding section 9, that is, from the inserting ends into the clamping sections 30, assures facilitated insertion of the holding section 9 into the clamping sections 30, while preventing the holding section from being detached from its clamped position, as shown in FIGS. 2 and 6.

Figure 7:
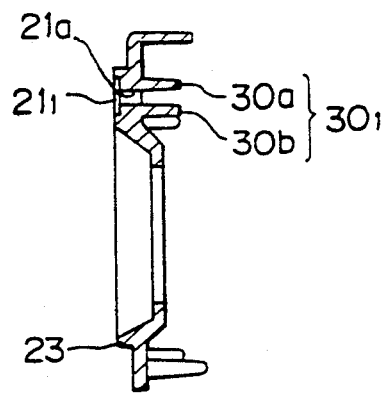
FIG. 7 is a cross-sectional view taken along line VII to VII of FIG. 6.

The front panel 11 is formed with a through-hole 21a substantially in register with the clamping sections $30_1$ to $30_4$, as shown in FIGS. 7 and 9. In this through-hole 21a is fitted a transparent or semi-transparent display plate $21_1$ to $21_4$, as shown in FIGS. 7, 9, 10 and 12.

Figure 12:
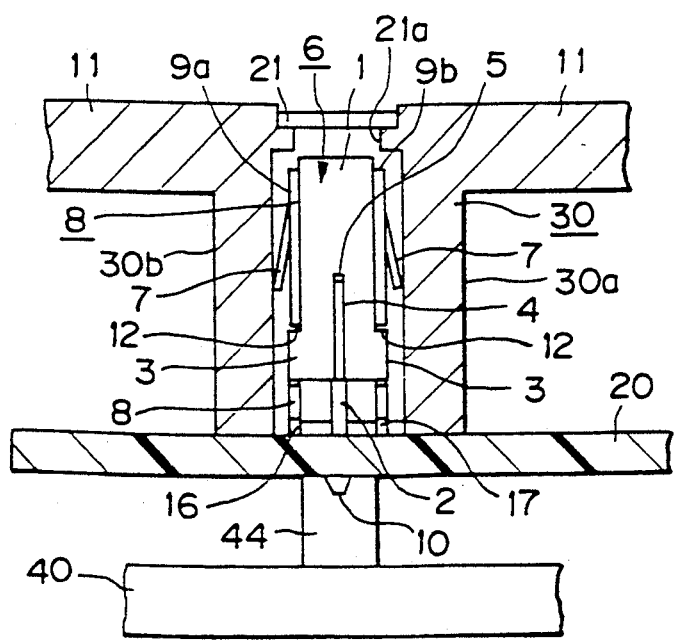
FIG. 12 is a cross-sectional side view showing the state in which an LED is mounted on a front panel.

The LED holder 8, supported by the printed circuit board 20 with the LEDs $6_1$ to $6_4$ held by the holding sections $9_1$ to $9_4$, is mounted on the front panel 11, by having the holding sections $9_1$ to $9_4$ clamped by the clamping sections $30_1$ to $30_4$, as shown in FIG. 12. At this time, the printed circuit board 20 is fixedly supported by a support, not shown, provided within the main body of the electronic apparatus.

The LEDs $6_1$ to $6_4$, thus held by the holding sections $9_1$ to $9_4$ by the LED holder 8 supported by the front panel 11, are positioned within the clamping sections $21_1$ to $21_4$, so that he light emitted by the LEDs $6_1$ to $6_4$ is transmitted through the display plates $21_1$ to $21_4$ to the front surface of the front panel 11.

Meanwhile, for maximizing the amount of light transmitted through the display plates $21_1$ to $21_4$, the LEDs $6_1$ to $6_4$ are arranged at the positions as close to the display plates $21_1$ to $21_4$ as possible. In other words, the height position setting sections $12_1$ to $12_4$ are arranged at the positions which take the luminosity of the LEDs $6_1$ to $6_4$ into account. That is, the height position setting sections $12_1$ to $12_4$ are provided at the positions such that the distal ends of the resin parts 1 of the LEDs $6_1$ to $6_4$ are as proximate to the display plates $21_1$ to $21_4$ as possible.

Figure 8:
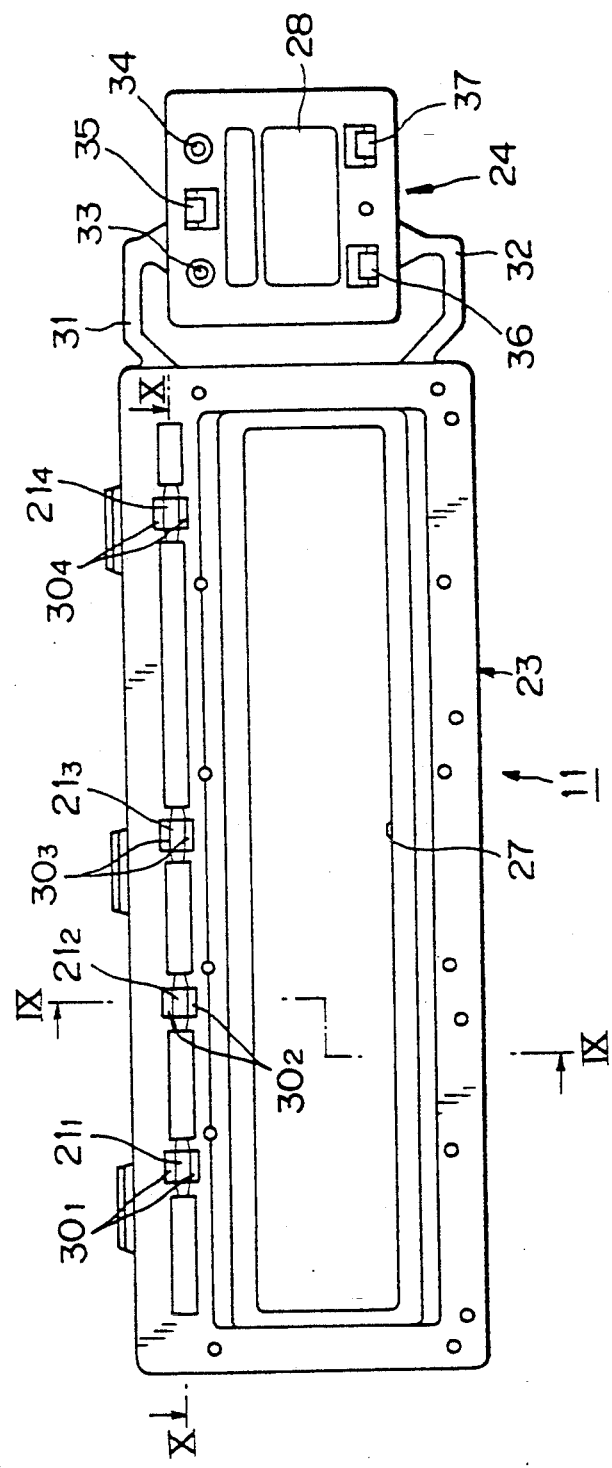
FIG. 8 is a back view of the front panel shown in FIG. 6.

The LED holder 8, combined with the printed circuit board 20 and LEDs $6_1$ to $6_4$, is supported by the front panel 11 by a resilient support provided by the resilient tongues 7 of the holding sections $9_1$ to $9_4$ and the clamping sections $30_1$ to $30_4$, and serve for securing the printed circuit board 20 by retention with pawls 35 to 37 shown in FIGS. 8 and 10.

In the embodiment illustrated, the electronic apparatus mounting the LED holder 8 is a recording/reproducing apparatus for an optical disc as a recording medium. Thus the front panel 11 in the present embodiment is made up of a display panel section 23, mounted on a front chassis 26 of the recording/reproducing apparatus and having a disc insertion/ejection opening 27 and display plates $21_1$ to $21_4$, and a switch section 24 mounting an ejection switch 25 to permit ejection of the optical disc, with the display panel section 23 and the switch section 24 being interconnected by bridging pieces 31, 32, as shown in FIG. 8. In the embodiment illustrated, the ejection switch 25 is made up of the sections 23, 24 molded separately and is mounted in position by the pawl 35 and the position setting pins 33, 34 molded integrally with the switch section 24.

Meanwhile, the front panel 11 of the present embodiment is fabricated by molding the synthetic resin which, as an example, is an electrically nonconducting material. Consequently, if the LEDs $6_1$ to $6_4$ are arranged within the front panel 11 formed by molding the electrically nonconducting synthetic resin, as in the present embodiment, there is a risk that static charges be intruded from an operator via elements of the LEDs $6_1$ to $6_4$ to the electronic circuit within the main body of the apparatus as noise to produce malfunctions or to destruct various driving circuits.

In this consideration, the LED holder 8 is formed of an electrically conductive metal material, while the holding lugs 9a, 9b constituting each of the holding sections $9_1$ to $9_4$ of the LEDs $6_1$ to $6_4$ are so contoured as to be projected towards the front surface of the front panel beyond the elements of the LEDs $6_1$ to $6_4$ or the inner leads 4, and the contacting section 44 is also provided on the LED holder 8 for being contacted with the chassis 40 of the main body of the electronic apparatus formed of an electrically conductive material, as shown in FIGS. 1 to 3, FIGS. 5, 12 and 13.

Consequently, static charges from the front surface of the front panel 11 are conducted to the contacting part 44 via the holding lugs 9a, 9b of the holding sections $9_1$ to $9_4$ projected towards the front panel 11, instead of via the elements of the LEDs $6_1$ to $6_4$, so as to flow from the contacting section 44 towards the chassis 40 which is at the grounding potential.

It will be seen from the above that the LED holder 8 of the present embodiment is comprised of holding sections $9_1$ to $9_4$ of an electrically conductive material, such as metal, contoured for being protruded away from the elements of the LEDs $6_1$ to $6_4$ towards the front surface of the front panel 11 and provided with resilient tongues 7 for preventing the holder 8 from being detached from the front panel 11, height position setting sections $12_1$ to $12_4$ for setting the height positions of the distal ends of the LEDs $6_1$ to $6_4$ held by the holding sections $9_1$ to $9_4$, a contacting section 44 of an electrically conductive material, adapted for being contacted with the chassis 40, and holder supports 13, 15 for supporting the holder with respect to the printed circuit board 20, whereby the holding of the LEDs $6_1$ to $6_4$ is facilitated and reliable anti-static measures as well as luminous display is assured by providing the LEDs at the positions as close to the front surface of the front panel 11 as possible.

What is claimed is:

1. An LED mounting holder for holding one and more LEDs for mounting within an electronic apparatus, said holder including a metallic plate being formed of an electrically conductive material and comprising: a plurality of holding sections provided at positions on the metallic plate corresponding to positions on a mounting base plate and for respectively receiving a plurality of LEDs; said holding sections holding said LEDs so as to project in a direction towards distal ends of the LEDs facing away from said mounting base plate; a plurality of height position setting sections provided at the positions on the metallic plate corresponding to positions on said mounting base plate for mounting one and more of the LEDs; said height position setting sections setting height positions of the distal ends of the LEDs held by said holding sections; a contacting section of an electrically conductive material for contacting with a main body of the electronic apparatus; and a holder supporting section for holding the metallic plate against said mounting base plate.

2. The LED mounting holder as claimed in claim 1 wherein said plurality of holding sections project beyond a light emitting element of the LED.

3. The LED mounting holder as claimed in claim 1 wherein said mounting base plate is a printed circuit board.

4. The LED mounting holder as claimed in claim 1 wherein said holder supporting section is fitted on one lateral side of said mounting base plate for supporting the holder by said mounting base plate.

5. The LED mounting holder as claimed in claim 1, wherein said holder is a bent metallic plate, and wherein
said holding sections holding the LEDs are formed by a pair of holding lugs bent upright from both lateral sides of a bottom plate of the bent metallic plate for resiliently holding a resin part of each LED, and wherein
said height position setting sections are formed at a mid part of said holding lugs of said holding section as openings engaged by projections formed on proximal sides of the resin part of each LED.

6. The LED mounting holder as claimed in claim 5 wherein the height position setting sections are all formed at the same level relative to the bottom plate of the LED mounting holder.

7. The LED mounting holder as claimed in claim 5 wherein, a pair of sidewall sections are formed facing each other on both sides of the bottom plate, and holding pieces forming the holding sections protrude from the distal ends of the sidewall sections.

8. The LED mounting holder as claimed in claim 5 wherein the contacting section for contacting the main body of the apparatus is a segmented part of the bottom plate of the LED mounting holder which is extended towards a lower side opposite the holding sections.

9. The LED mounting holder as claimed in claim 5 wherein the bottom plate of the holder is provided with an opening for allowing a plurality of external connection terminals projected from the proximal end of the LED protruded towards a lower side of the bottom plate.

10. The LED mounting holder as claimed in claim 5 wherein the holder support is a depending portion extending downwards from one side of the bottom plate and an extension having a horizontal portion bent off from the depending portion in a direction facing said bottom plate, said bottom plate and the horizontal portion clamping a lateral edge of the mounting base plate in-between for holding the holder by said mounting base plate.

11. The LED mounting holder as claimed in claim 10 wherein the LED held by the holding section with said external connection terminals projected below said bottom plate in the holder via an opening formed in said bottom plate and with a projection on the proximal side of the resin part engaged in the height setting section has said external connection terminal introduced into through-holes formed in a printed circuit board comprising said mounting base plate so as electrically connected to said printed circuit board by solder.

12. An LED mounting device for mounting a plurality of LEDs on a printed circuit board, comprising:
a holder,
said holder having a plurality of holding sections provided at positions on the holder in register with mounting positions of said LEDs on the printed circuit board; said holding sections each holding each one of the LEDs and being projected towards the distal end of the LED held thereby; a plurality of height position setting sections provided at positions on said holder corresponding to positions on said printed circuit board adapted to receive said LEDs; said height setting sections setting the height positions of the distal ends of the LEDs held by said holding sections; and a contacting section of an electrically conductive material for contacting with a main body of the electronic apparatus;
said LEDs being each held by said holding section at a mounting height position as set by being partially engaged in said height position setting sections; said LEDs being mounted by having an external connection terminal introduced through throughholes bored in the printed circuit board and electrically connected to said printed circuit board by solder;
said holder holding the LEDs being supported by a plurality of holder supports on said printed circuit board.

13. The LED mounting device as claimed in claim 12 wherein said holder is mounted on a front panel of an electrically nonconductive material by said holding sections holding the LEDs being engaged in a plurality of clamping sections provided on a plurality of inner lateral sides of said front panel of an electrically nonconductive material constituting a main body of an electronic apparatus.

14. The LED mounting device as claimed in claim 13 wherein
the holding sections of the holder mounted on the front panel are formed with tongues extending outwards.

15. The LED mounting device as claimed in claim 13 wherein
the holder for mounting the LEDs has its contacting section contacted with a part of the main body of the electronic apparatus formed of an electrically conductive material when the holder is mounted on said front panel.

16. The LED mounting device as claimed in claim 13 wherein said front panel has an opening formed therein for transmitting light from said plurality of LEDs therethrough; said opening being formed in register with said clamping sections and being covered by a light-transmitting display plate.

* * * * *

UNITED STATES PATENT AND TRADEMARK OFFICE
CERTIFICATE OF CORRECTION

PATENT NO. : 5,299,096
DATED : March 29, 1994
INVENTOR(S) : Yoshikazu Ishimatsu

It is certified that error appears in the above-indentified patent and that said Letters Patent is hereby corrected as shown below:

Col. 10, line 29, after "being" insert --each--

Signed and Sealed this

Twentieth Day of February, 1996

Attest:

BRUCE LEHMAN

Attesting Officer

Commissioner of Patents and Trademarks